(12) United States Patent
Sitorus et al.

(10) Patent No.: US 10,578,679 B2
(45) Date of Patent: *Mar. 3, 2020

(54) MAGNETIC FIELD SENSORS HAVING VIRTUAL SIGNALS

(71) Applicant: Allegro MicroSystems, LLC, Manchester, NH (US)

(72) Inventors: Timothy Sitorus, Manchester, NH (US); Eric G. Shoemaker, Windham, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 32 days.

This patent is subject to a terminal disclaimer.

(21) Appl. No.: 16/010,969

(22) Filed: Jun. 18, 2018

(65) Prior Publication Data

US 2019/0383885 A1    Dec. 19, 2019

(51) Int. Cl.
| | |
|---|---|
| *G01R 33/00* | (2006.01) |
| *G01R 33/09* | (2006.01) |
| *G01R 33/07* | (2006.01) |
| *G01D 5/245* | (2006.01) |

(52) U.S. Cl.
CPC ..... *G01R 33/0023* (2013.01); *G01R 33/0094* (2013.01); *G01R 33/07* (2013.01); *G01R 33/09* (2013.01); *G01D 5/245* (2013.01)

(58) Field of Classification Search
CPC .. G01R 31/311; G01R 31/2656; G01R 1/071; G01R 31/2635; G01R 31/31728; H01L 21/681; H01L 31/0232
USPC ....... 324/97, 750.23, 750.27, 754.21–754.31
See application file for complete search history.

(56) References Cited

U.S. PATENT DOCUMENTS

| | | | | |
|---|---|---|---|---|
| 5,430,292 | A | * 7/1995 | Honjo | ............... G03F 1/86 250/310 |
| 9,182,456 | B2 | 11/2015 | Shoemaker et al. | |
| 9,417,295 | B2 | 8/2016 | Friedrich et al. | |
| 2006/0076503 | A1 | * 4/2006 | Tsao | ............... H01J 37/228 250/396 R |
| 2006/0273263 | A1 | * 12/2006 | Raymond | ......... G01B 11/0616 250/492.2 |

(Continued)

OTHER PUBLICATIONS

Allegro MicroSystems, LLC Datasheet; "ATS605LSG; Dual Output Differential Speed and Direction Sensor IC;" Rev.2; Jun. 15, 2017; 17 pages.

(Continued)

*Primary Examiner* — Giovanni Astacio-Oquendo
(74) *Attorney, Agent, or Firm* — Daly, Crowley, Mofford & Durkee, LLP

(57) ABSTRACT

A magnetic field sensor includes a plurality of magnetic field sensing elements configured to generate at least two measured magnetic field signals indicative of a magnetic field affected by an object and having a first predetermined phase difference with respect to each other and a controller responsive to the at least two measured magnetic field signals. The controller is configured to generate at least one virtual magnetic field signal having a second predetermined phase difference with respect to at least one of the measured magnetic field signals. In embodiments, the virtual magnetic field signal has the second predetermined phase difference with respect to each of the at least two measured magnetic field signals.

23 Claims, 8 Drawing Sheets

(56) References Cited

U.S. PATENT DOCUMENTS

| | | | |
|---|---|---|---|
| 2014/0139218 A1* | 5/2014 | Findeklee | G01R 33/3628 324/318 |
| 2014/0210472 A1* | 7/2014 | Homann | G01R 33/36 324/309 |
| 2014/0253122 A1* | 9/2014 | Leussler | G01R 33/4215 324/309 |
| 2017/0219662 A1 | 8/2017 | Prentice et al. | |
| 2017/0336225 A1 | 11/2017 | Burdette et al. | |

OTHER PUBLICATIONS

U.S. Appl. No. 16/290,017, filed Mar. 1, 2019, Shoemaker et al.
Office Action dated Oct. 11, 2019 for U.S. Appl. No. 16/290,017; 8 pages.
Terminal Disclaimer dated Dec. 10, 2019 for U.S. Appl. No. 16/290,017, 2 pages.
Response to Office Action dated Dec. 11, 2019 for U.S. Appl. No. 16/290,017, 11 pages.

* cited by examiner

MAGNETIC FIELD SENSORS HAVING VIRTUAL SIGNALS

CROSS-REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors and more particularly, to magnetic field sensors having virtual magnetic field signals for providing high resolution outputs.

BACKGROUND

As is known, sensors are used in various types of devices to measure and monitor properties of systems in a wide variety of applications. For example, sensors have become common in products that rely on electronics in their operation, such as automotive and motor control systems.

Some sensors monitor properties by detecting a magnetic field associated with proximity or movement of a target object with respect to one or more magnetic field sensing elements. In magnetic field sensors including multiple magnetic field sensing elements, magnetic field signals from the sensing elements can be processed by separate processing channels to generate respective phase separated signals. One such magnetic field sensor is the Allegro MicroSystems, LLC ATS605LSG Dual Output Differential Speed and Direction Sensor IC, in which the output signal from each of the two processing channels is provided at a respective output pin of the sensor integrated circuit (IC). The channel output, or speed signals can be provided in the form of two-state binary signals having a frequency indicative of the speed of rotation of the target object. Additional output signals can include a direction signal indicative of a direction of rotation of a target object and/or an exclusive OR (XOR) speed signal that provides a signal resulting from an XOR logic operation based on the speed signals.

There are applications for which it is desirable that a magnetic field sensor provide a higher resolution of angular detection of the target object than can be accomplished with two speed signals or the XOR speed signal, for example to permit tighter control and better reactivity to change in position. While angular resolution can be increased by using additional sensors in different physical locations and/or by using more complex targets, these solutions can require more physical size for the sensor installation, higher costs for more sensing components, and/or more manufacturing complexity.

SUMMARY

According to the disclosure, a magnetic field sensor includes a plurality of magnetic field sensing elements configured to generate at least two measured magnetic field signals indicative of a magnetic field affected by an object and having a first predetermined phase difference with respect to each other and a controller responsive to the at least two measured magnetic field signals and configured to generate at least one virtual magnetic field signal having a second predetermined phase difference with respect to at least one of the measured magnetic field signals. With this arrangement, the magnetic field sensor can provide higher resolution target detection capability with a target having a fixed number of switching features without requiring the use of additional sensing elements.

Features of the disclosure may include one or more of the following, alone or in combination. In embodiments, the phase difference between the virtual magnetic field signal and each of the at least two measured magnetic field signals can be the same. The controller can be configured to generate the at least one virtual magnetic field signal according to a mathematical function that characterizes a relationship between the second predetermined phase difference and each of the at least two measured magnetic field signals. The mathematical function used to generate the at least one virtual magnetic field signal may be based on a cosine of the second predetermined phase difference and a sine of the second predetermined phase difference. In embodiments, the controller comprises a look-up table containing cosine values of the second predetermined phase difference and sine values of the second predetermined phase difference. The first predetermined phase difference between the at least two measured magnetic field signals may be approximately ninety degrees.

In embodiments, the controller is responsive to the at least two measured magnetic field signals to generate a plurality of virtual magnetic field signals, each having a respective, different predetermined phase difference with respect to each of the at least two measured magnetic field signals. The controller may be programmable to select the second predetermined phase difference of the at least one virtual magnetic field signal. The controller may be configured to compare each of the at least two measured magnetic field signals to a threshold to generate respective channel output signals and to compare the at least one virtual magnetic field signal to the threshold to generate a virtual channel output signal.

The plurality of magnetic field sensing elements may comprise one or more Hall effect elements and/or magnetoresistance elements. In embodiments, the plurality of magnetic field sensing elements comprises at least one first element having an axis of maximum sensitivity in a first plane and at least one second element having an axis of sensitivity in a second plane orthogonal to the first plane. The magnetic field sensor may further comprise a back bias magnet to generate the magnetic field and the object may comprise a ferromagnetic object.

Also described is a method including generating at least two measured magnetic field signals indicative of a magnetic field affected by an object, wherein the at least two measured magnetic field signals have a first predetermined phase difference with respect to each other and processing the at least two measured magnetic field signals to generate at least one virtual magnetic field signal having a second predetermined phase difference with respect to at least one of the measured magnetic field signals. Processing the at least two measured magnetic field signals may comprise generating the at least one virtual magnetic field signal having the second predetermined phase difference with respect to each of the at least two measured magnetic field signals.

Features of the disclosure may include one or more of the following, alone or in combination. Processing the at least two measured magnetic field signals may comprise computing values of the at least one virtual magnetic field signal according to a mathematical function that characterizes a relationship between the second predetermined phase difference and each of the at least two measured magnetic field signals. Computing values of the at least one virtual magnetic field signal according to the mathematical function may comprise computing a cosine of the second predetermined phase difference and a sine of the second predetermined phase difference.

In embodiments, processing the at least two measured magnetic field signals includes generating a plurality of virtual magnetic field signals, each having a respective, different predetermined phase difference with respect to each of the at least two measured magnetic field signals. Processing the at least two measured magnetic field signals may comprise responding to a programmable selection of the second predetermined phase difference. The method may further comprise generating at least two channel output signals by comparing the at least two measured magnetic field signals to a threshold and generating a virtual channel output signal by comparing the at least one virtual magnetic field signal to the threshold.

In embodiments, generating at least two measured magnetic field signals may comprise using one or more Hall effect elements and/or magnetoresistance elements. Generating at least two measured magnetic field signals may comprise using differential signals from three spaced Hall effect elements. Generating at least two measured magnetic field signals may comprise using at least one first element having an axis of maximum sensitivity in a first plane and at least one second element having an axis of sensitivity in a second plane orthogonal to the first plane.

According to a further aspect, apparatus includes means for generating at least two measured magnetic field signals indicative of a magnetic field affected by an object and having a first predetermined phase difference with respect to each other and means for generating at least one virtual magnetic field signal based on the at least two measured magnetic field signals, the at least one virtual magnetic field signal having a second predetermined phase difference with respect to at least one of the measured magnetic field signals.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
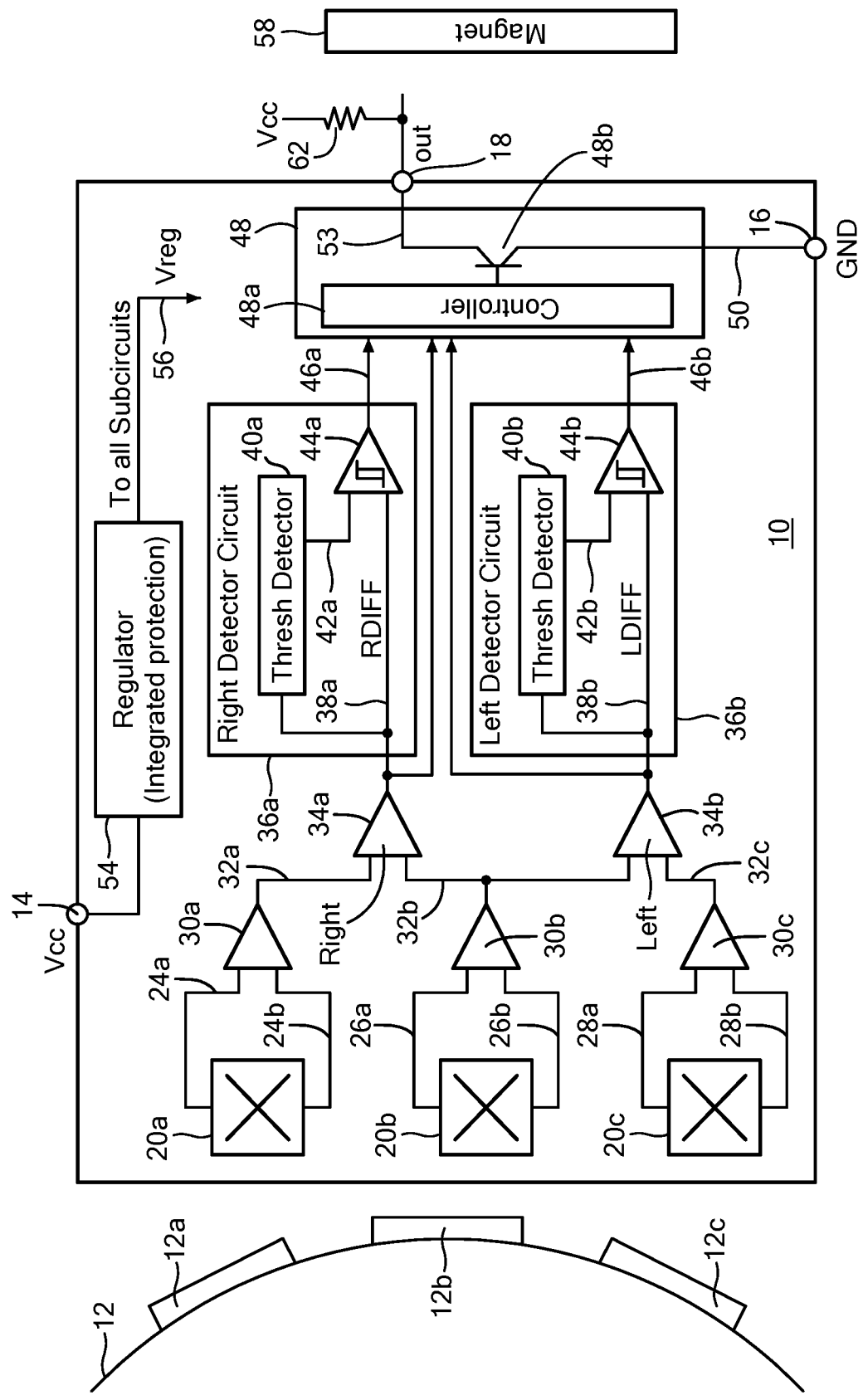
FIG. 1 shows a voltage-level output magnetic field sensor according to the disclosure.

Before describing the present invention, some introductory concepts and terminology are explained. As used herein, the term "rotation detector" is used to describe a circuit that includes at least one "magnetic field sensing element" which detects a magnetic field. The rotation detector can sense movement, e.g., rotation, of a ferromagnetic object, for example, advance and retreat of magnetic domains of a ring magnet or advance and retreat of gear teeth of a ferromagnetic gear. Similarly, the term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

It should be understood that a so-called "comparator" can be comprised of an analog comparator having a two state output signal indicative of an input signal being above or below a threshold level (or indicative of one input signal being above or below another input signal). However the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Ferromagnetic objects described herein can have a variety of forms, including, but not limited to a ring magnet having one or more pole pair or a gear having two or more gear teeth. Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects that move linearly are possible.

Referring to FIG. 1, a magnetic field sensor 10 as may take the form of a rotation detector can be used, for example, to detect passing gear teeth, for example, gear teeth 12a-12c of a ferromagnetic gear or, more generally target object 12. A permanent magnet 58 can be placed at a variety of positions proximate to the gear 12, resulting in fluctuations of a magnetic field proximate to the gear as the gear rotates. Use of the magnet 58 results in a so-called "back-bias" arrangement.

The sensor 10 can have a first terminal 14 coupled to a power supply denoted as Vcc and a second terminal 16 coupled to a fixed voltage, for example, a ground voltage, denoted as GND. A third terminal 18 of the sensor 10 permits communication of a sensor output signal 53 to circuits and systems external to the sensor. The sensor output signal 53 can be provided in the form of a voltage signal (as shown in FIG. 1) or a current signal. The illustrated sensor 10 can be considered a three terminal device (i.e., a three-wire device) since it has third terminal 18 at which output signal 53 is provided. Sensor 10 can be provided in the form of an integrated circuit (IC), with terminals 14, 16, 18 provided by pins or leads of the IC.

The sensor 10 can include first, second, and third magnetic field sensing elements 20a, 20b, 20c, respectively, here shown to be Hall effect elements. The first Hall effect element 20a generates a first differential voltage signal 24a, 24b, the second Hall effect element 20b generates a second differential voltage signal 26a, 26b, and the third Hall effect element 20c generates a third differential voltage signal 28a, 28b, each having respective AC signal components in response to the rotating target 12.

While each one of the Hall effect elements 20a, 20b, 20c is shown to be a two terminal device, one of ordinary skill in the art will understand that each of the Hall effect elements 20a, 20b, 20c is actually a four terminal device and the other two terminals of the Hall effect elements can be coupled to receive and pass respective currents as might be provided, for example, by a current source or by a voltage source (not shown).

First differential voltage signal 24a, 24b can be received by a first differential preamplifier 30a, the second differential voltage signal 26a, 26b can be received by a second differential preamplifier 30b, and the third differential voltage signal 28a, 28b can be received by a third differential preamplifier 30c. First and second amplified signals 32a, 32b generated by the first and second differential preamplifiers 30a, 30b, respectively, are received by a "right" channel amplifier 34a and the second amplified signal 32b and a third amplified signal 32c generated by the second and third differential preamplifiers 30b, 30c, respectively, are received by a "left" channel amplifier 34b. Designations of "right" and "left" are arbitrary.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature and further coupled to a controller 48a. Signals 38a, 38b are referred to herein generally as measured magnetic field signals, which signals are indicative of a magnetic field affected by the target object 12, such as by movement (e.g., rotation) of the target 12. Thus, the sensor 10 can be considered to include a right processing channel (or simply right channel) including amplifier 34a and right detector circuit 36a and a left processing channel (or simply left channel) including amplifier 34b and detector circuit 36b.

It will be appreciated that a "channel" refers generally to processing circuitry associated with one or more magnetic field sensing elements and configured to generate a respective channel signal. While the particular processing circuitry shown in FIG. 1 to provide the right channel circuitry includes right channel amplifier 34a and right channel detector circuit 36a (and similarly the processing circuitry shown in FIG. 1 to provide the left channel circuitry includes left channel amplifier 34b and left channel detector circuit 36b), such channels can include less, more, or different processing circuitry.

Since the magnetic field sensing elements 20a, 20b that contribute to the magnetic field signal 38a are physically spaced from the magnetic field sensing elements 20b, 20c that contribute to the magnetic field signal 38b, it should be appreciated that the measured magnetic field signals 38a, 38b are separated in phase. The phase difference, or separation between magnetic field signals 38a, 38b can be based on the target feature size and the spacing between the magnetic field sensing elements 20a-20c. In embodiments, the phase separation between signals 38a, 38b can be approximately ninety degrees (i.e., the signals can be approximately in a quadrature relationship). However, it will be appreciated that other phase relationships between the magnetic field signals are possible.

Furthermore, as will be explained below, while the physical separation of sensing elements 20a-20c and their differential coupling to generate the measured magnetic field signals 38a, 38b illustrates one way to generate phase separated measured magnetic field signals, other configurations and techniques are also possible as shown for example in FIG. 1A and FIG. 1B. By way of non-limiting examples, channels can be based on (i.e., can process) signals from independent (i.e., not differentially combined) magnetic field sensing elements and the phase separation of the resulting measured magnetic field signals can be achieved by the angular difference of the element positions and/or by the use of different sensing element types having axes of maximum sensitivity in different planes (e.g., see FIG. 1A). In some embodiments, some channels can be based on signals from independent magnetic field sensing elements and other channels can be based on differentially combined signals from a plurality of magnetic field sensing elements (e.g., FIG. 1B). Additional magnetic field sensing element configurations can be found in a co-pending U.S. patent application Ser. No. 15/596,514 entitled "Magnetic Field Sensors and Output Signal Formats for a Magnetic Field Sensor" filed on May 6, 2017 assigned to the Assignee of the subject application and incorporated by reference herein in its entirety.

According to the disclosure, one or more virtual magnetic field signals are generated in response to the measured magnetic field signals 38a, 38b. Virtual magnetic field signal is used herein to describe a signal that is indicative of a magnetic field affected by a target object, but which signal is computationally generated based on plurality of phase separated measured magnetic field signals which phase separated measured magnetic field signals are generated by one or more respective magnetic field sensing elements.

Taking the right channel detector circuit 36a as representative of both of the detector circuits 36a, 36b, the right channel detector circuit 36a includes a threshold detector circuit 40a coupled to receive the signal 38a. The threshold detector circuit 40a is configured to detect positive and negative peaks of the signal 38a, to identify a peak-to-peak value of the signal 38a, and to generate a threshold signal 42a that, for example, takes on a first threshold value at forty percent of the peak-to-peak value of the signal 38a and a second threshold value at sixty percent of the peak-to-peak value of the signal 38a. A comparator 44a is coupled to receive the threshold signal 42a and is also coupled to receive the signal 38a. As a result, the comparator 44a generates a binary, two-state, signal 46a that has transitions when the signal 38a crosses the first and second thresholds.

A signal 46b generated by the left channel detector circuit 36b is generated in the same way as the signal 46a. However, since the magnetic field sensing elements 20a, 20b contribute to the signal 46a, while the magnetic field sensing elements 20b, 20c contribute to the signal 46b, it should be appreciated that the signals 46a, 46b have edges that differ in time (which is equivalent to phase for a particular signal frequency, i.e., particular rotation speed). Thus, the detector circuits 36a, 36b are configured to generate respective phase separated channel output, or speed signals 46a, 46b.

As will be explained, sensor 10 can generate additional channel output signals based on the one or more virtual magnetic field signals, as may be referred to herein as virtual channel output signals (see FIGS. 2 and 4 for example). These additional, virtual channel output signals can be generated in a similar fashion to channel output signals 46a, 46b, generally by comparison of virtual magnetic field signals to one or more thresholds.

Movement speed of the target 12 can be detected in accordance with the frequency of either of the phase separated channel signals 46a, 46b. In this way channel signals 46a, 46b can be considered to contain redundant target speed information. It should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

While the sensor 10 is shown to include the detector circuits 36a, 36b, each having a particular topology, described above as peak-to-peak percentage detectors (threshold detectors), it should be understood that any form of detectors may be used, such as peak-referenced detectors (peak detectors).

An output module 48 can include controller 48a to receive and process the phase separated measured magnetic field signals 38a, 38b and generate one or more virtual magnetic field signals based on the measured magnetic field signals, as will be explained. Additionally, controller 48a can generate one or more virtual channel output signals based on respective virtual magnetic field signals. The controller 48a is further configured to generate sensor output signal 53 in a desired format, which output signal 53 may represent more than one signal. For example, output signal 53 may include one or more of channel output signals as two-state binary signals having a frequency indicative of the speed of rotation of the target object, a direction signal indicative of a direction of rotation of a target object and/or an exclusive OR (XOR) speed signal that provides a signal resulting from an XOR logic operation based on the channel output signals. The channel output signals provided at the output of the sensor may include channel output signals 46a, 46b and additional channel output signals generated based on respective virtual magnetic field signals as will be explained.

In the illustrated three wire sensor 10, the output driver 48b may take the form of an open-drain output. In this configuration, the driver 48b may include a bipolar transistor having a drain terminal coupled to Vcc through a pull up resistor 62, as shown.

Figure 1A:
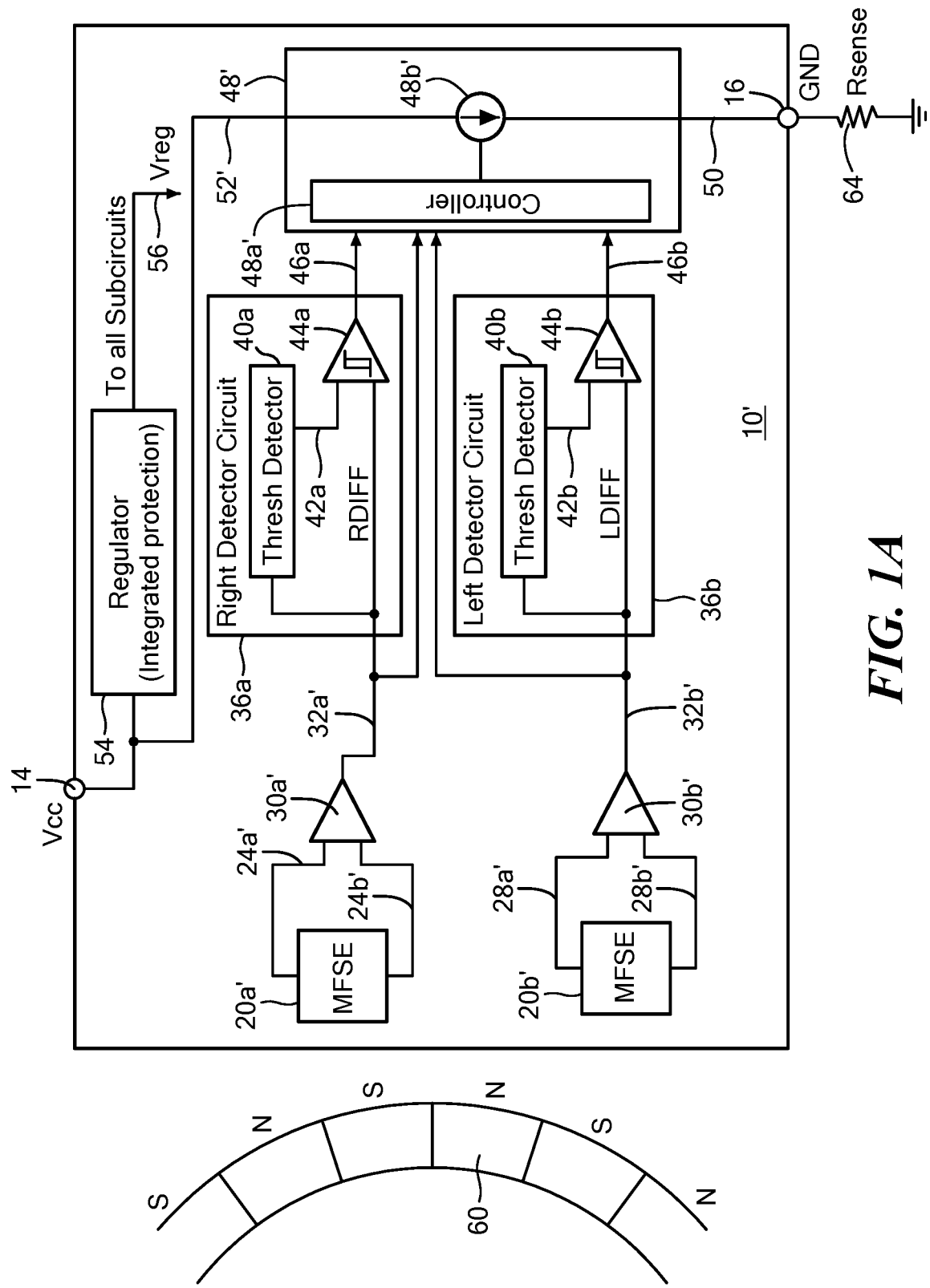
FIG. 1A shows a current-level output magnetic field sensor according to the disclosure.

Referring also to FIG. 1A, an alternative magnetic field sensor 10' as may take the form of a rotation detector can be used to detect rotation of a ring magnet 60 having at least one north pole and at least one south pole. Thus, the sensor 10' differs from the sensor 10 of FIG. 1 in that the magnet 58 is omitted and gear 12 is replaced by ring magnet 60.

The sensor 10' further differs from the sensor 10 of FIG. 1 in that sensor 10' is a so-called two terminal device (or two-wire device), for which an output signal 52' is provided in the form of a current at the two terminal power connection, superimposed upon the power supply voltage, Vcc, which current may be detected across a sense resistor 64. To this end, an output module 48' can include a controller 48a' and an output driver 48b', as may take the form of voltage-controlled current source. Various circuitry is possible to implement the voltage controlled current source 48b' such as an operational amplifier controlling current through a pass element such as bipolar transistor. While the sense resistor 64 is shown coupled to the GND terminal 16, the sense resistor may alternatively be coupled to the Vcc terminal 14. In embodiments in which the sensor 10' is provided in the form of an integrated circuit (IC), terminals 14, 16, are provided by pins or leads of the IC.

The sensor 10' further differs from the sensor 10 of FIG. 1 in that sensor 10' illustrates the use of independent, physically spaced apart magnetic field sensing elements 20a', 20b'. In embodiments, magnetic field sensing elements 20a', 20b' may take the form of magnetoresistance elements or other types of magnetic field sensing elements including Hall effect elements. For example, sensing elements 20a', 20b' may each take the form of a bridge configuration containing a plurality of magnetoresistance elements, with each such bridge physically spaced from the other. Alternatively, sensing elements 20a', 20b' may each take the form of a different sensing element type, each having an axis of maximum sensitivity in a plane that is orthogonal with respect to the plane in which the axis of maximum sensitivity of the other element lies as illustrated in FIG. 1B. With this type of arrangement, the phase separation of the resulting measured magnetic field signals can be achieved by the angular difference of the element positions and need not rely on the physical separation between the elements.

Each element 20a', 20b' can provide a respective differential signal 24a', 24b', 28a', 28b' to a respective amplifier 30a', 30b' as shown. Amplifiers 30a', 30b' in turn can provide respective measured magnetic field signals 32a', 32b' to right and left detector circuits 36a, 36b and to controller 48a', as shown. Measured magnetic field signals 32a', 32b' may thus, be similar to phase separated measured magnetic field signals 38a, 38b of FIG. 1 and thus, may be used by controller 48a' to generate one or more virtual magnetic field signals.

Figure 1B:
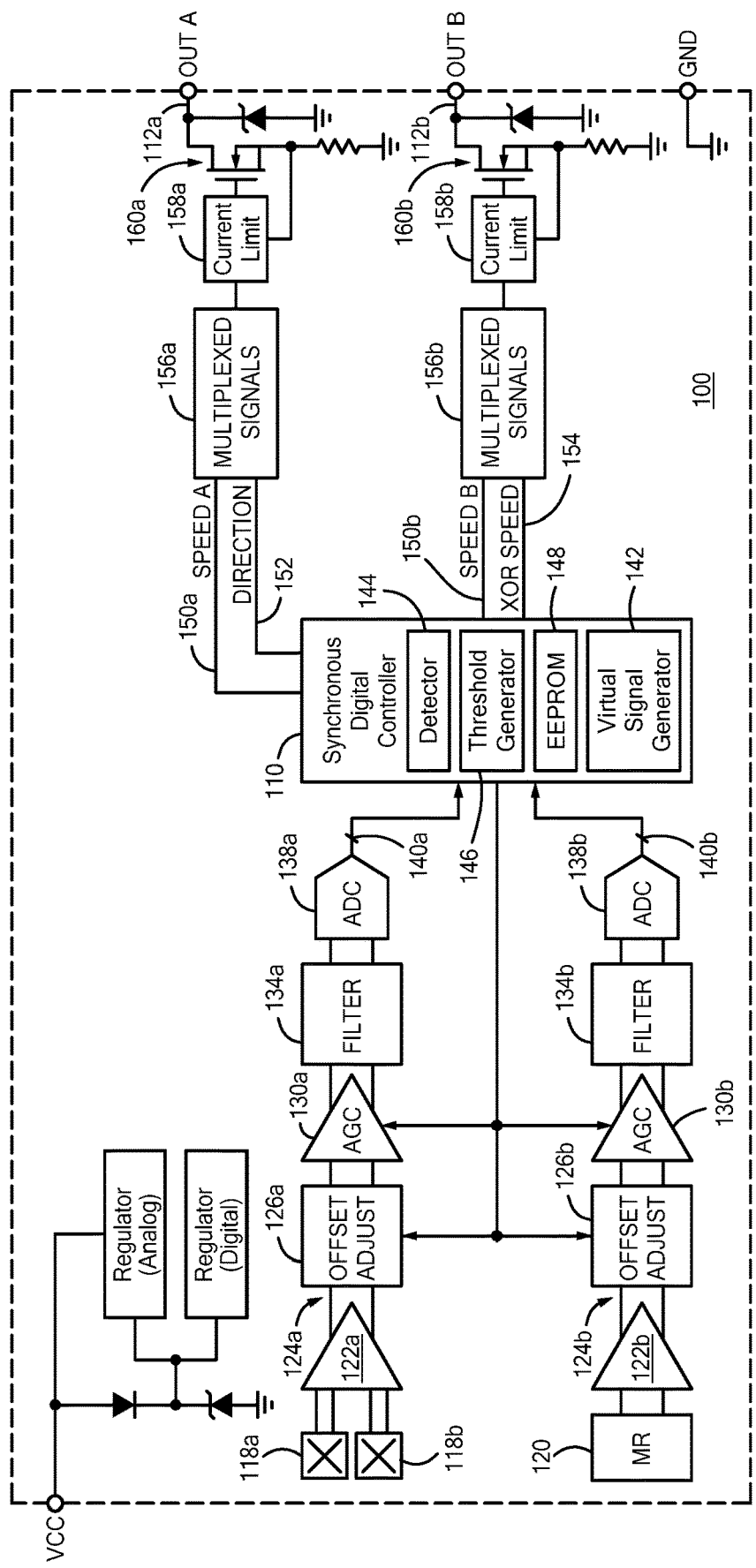
FIG. 1B shows an alternative voltage-level output magnetic field sensor according to the disclosure.

Referring also to FIG. 1B, an alternative magnetic field sensor 100 includes a digital controller 110. Sensor 100 can take the form of a rotation detector to detect rotation of a target (e.g., gear 12 of FIG. 1 or ring magnet 60 of FIG. 1A) and provide one or more output signals 112a, 112b containing speed, direction, vibration, or other target information.

Sensor 100 illustrates a magnetic field sensing element configuration including one or more first sensing elements 118a, 118b each having an axis of maximum sensitivity in a first plane and one or more second sensing elements 120 having an axis of maximum sensitivity in a second plane generally orthogonal with respect to the first plane. As one example, as illustrated, the first sensing elements 118a, 118b may be planar Hall effect elements and the second sensing element 120 may take the form of one or more magnetoresistance elements. Outputs of sensing elements 118a, 118b can be differentially combined by amplifier 122a and outputs of sensing element 120 can be provided to amplifier 122b to generate respective measured magnetic field signals 124a, 124b. With this type of arrangement, the phase separation of the resulting measured magnetic field signals 124a, 124b can be achieved by use of the different types of sensing elements having axes of maximum sensitivity in different planes and need not rely on the physical separation between the elements.

Processing of the measured magnetic field signals 124a, 124b can include offset adjustment by modules 126a, 126b, automatic gain control by elements 130a, 130b, filtering by filters 134a, 134b, and analog-to-digital conversion by ADCs 138a, 138b. The resulting measured magnetic field signals 140a, 140b thus processed are coupled to digital controller 110 as shown.

Digital controller 110 is configured to generate one or more virtual magnetic field signals based on the measured magnetic field signals 140a, 140b. To this end, controller 110 can include a virtual signal generator 142, the operation of which will be described further below. Controller 110 can be further configured to generate one or more channel output signals 150a, 150b that may be the same as or similar to channel output signals 46a, 46b of FIG. 1. To this end, controller 110 can include a detector 144 that may provide functionality similar to or the same as detectors 36a, 36b of FIG. 1 and a threshold generator 146 that may provide functionality similar to or the same as threshold detectors 40a, 40b of FIG. 1. Memory 148, such as EEPROM, can be used to store values for use by the virtual signal generator 142 and the detector 144 for example.

One or more output signals of controller 110 can include channel output signals 150a, 150b that may be the same as or similar to channel output signals 46a, 46b (FIG. 1), a direction signal 152 indicative of a direction of rotation of a target, and an XOR speed signal 154 indicative of an exclusive-OR combination of channel output signals 150a, 150b for example. Additional output signals can be provided on the illustrated or additional signal lines and can include additional channel output signals based on the one more virtual measured magnetic field signals. These new additional output switching locations can also be incorporated into the existing output signals through the use of logic gates to provide higher resolution position information without the need for additional output pins on the IC.

Figure 1C:
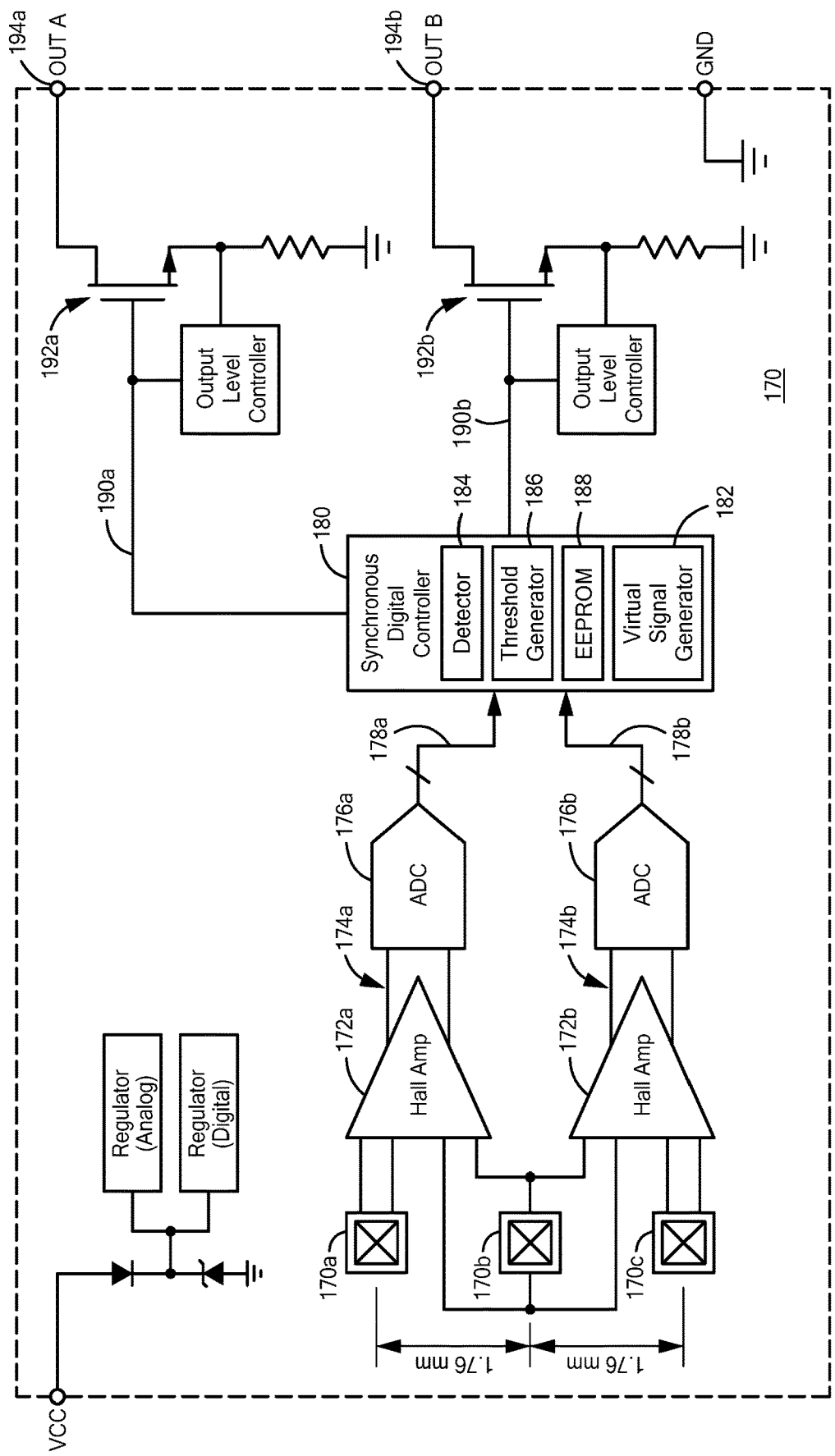
FIG. 1C shows another alternative voltage-level output magnetic field sensor according to the disclosure.

Referring also to FIG. 1C, another alternative magnetic field sensor 170 includes a digital controller 180. Sensor 170 includes a magnetic field sensing element configuration like FIG. 1 and thus includes Hall effect elements 170a, 170b, 170c, each providing an output signal to a respective differential amplifier 172a, 172b to generate respective measured magnetic field signals 174a, 174b, as shown. The phase difference, or separation between measured magnetic field signals 174a, 174b can be approximately ninety degrees (i.e., the signals can be approximately in a quadrature relationship).

Processing of the measured magnetic field signals 174a, 174b can be performed more in the digital domain than in the embodiment of FIG. 1B. Accordingly, measured magnetic field signals 174a, 174b can be converted to respective digital signals by ADCs 176a, 176b, as shown. Offset adjustment, gain control, filtering and other types of signal processing functionality can be implemented by controller 180.

Digital controller 180 is configured to generate one or more virtual magnetic field signals based on the measured magnetic field signals 178a, 178b. To this end, controller 180 can include a virtual signal generator 182, the operation of which will be described further below. Controller 180 can be further configured to generate one or more channel output signals that may be the same as or similar to channel output signals 46a, 46b of FIG. 1. To this end, controller 180 can include a detector 184 that may provide functionality similar to or the same as detectors 36a, 36b of FIG. 1 and a threshold generator 186 that may provide functionality similar to or the same as threshold detectors 40a, 40b. Memory 188, such as EEPROM, can be used to store values for use by the virtual signal generator 182 and the detector 184 for example.

One or more output signals 190a, 190b of controller 180 can include channel output signals that may be the same as or similar to channel output signals 46a, 46b (FIG. 1), a direction signal indicative of a direction of rotation of a target, and an XOR speed signal indicative of an exclusive-OR combination of channel output signals for example. Additional output signals can be provided on the illustrated or additional signal lines and can include additional channel output signals based on the one more virtual measured magnetic field signals. These new additional output switching locations can also be incorporated into the existing output signals through the use of logic gates to provide higher resolution position information without the need for additional output pins on the IC. Controller output signals 190a, 190b can be coupled to respective output drivers 192a, 192b to provide sensor output signals 194a, 194b containing desired information in a desired format.

Figure 2:
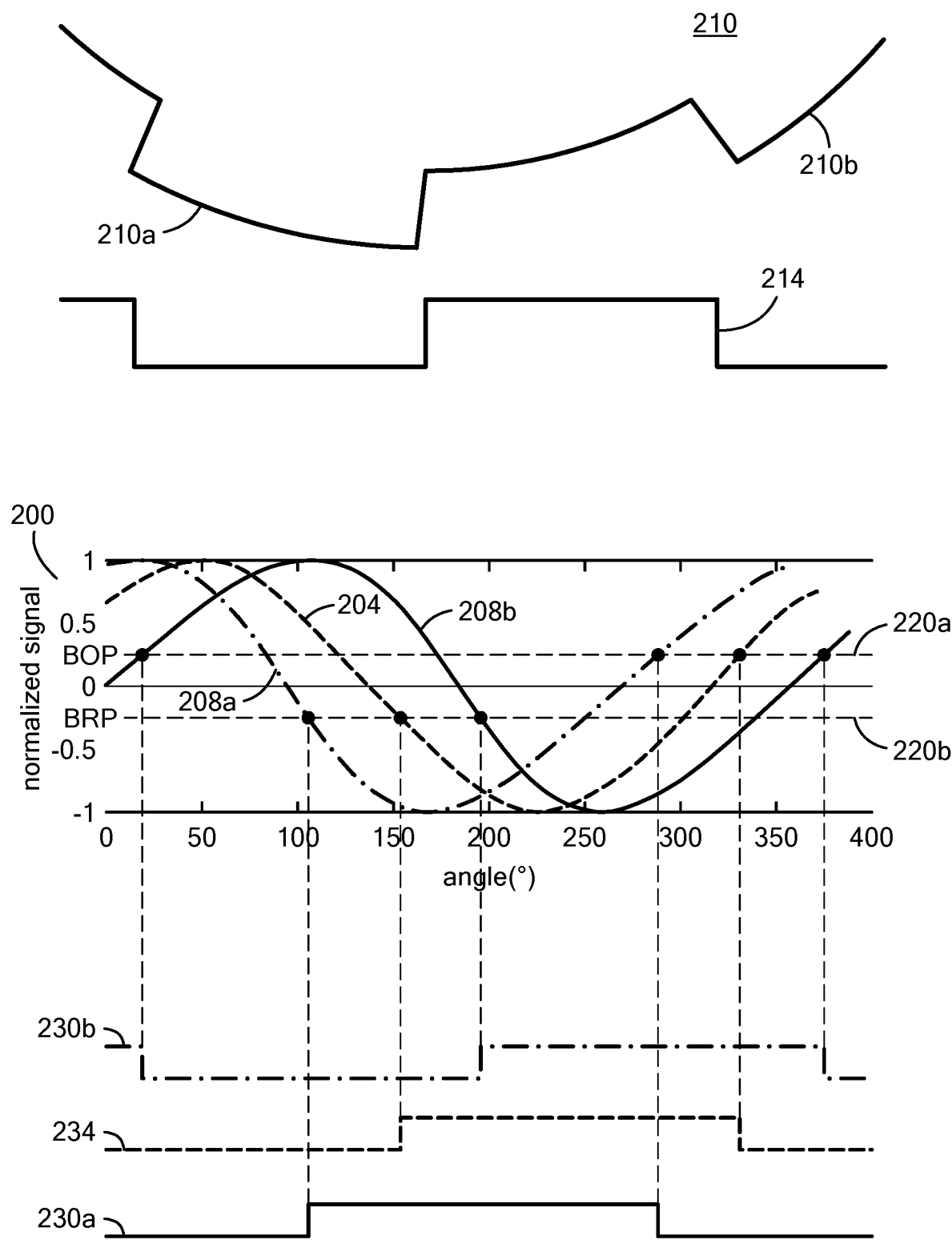
FIG. 2 shows example waveforms, including measured magnetic field signals, a virtual magnetic field signal, and associated channel output signals according to the disclosure as may be generated by any of the sensors of FIGS. 1-1C.

Referring to FIG. 2, generation of a virtual magnetic field signal 204 as may be achieved by any of the above-described sensors 10, 10', 100, 170 (see FIGS. 1-1C, respectively) is illustrated. Virtual magnetic field signal 204 is shown along with measured magnetic field signals 208a, 208b in waveforms 200 against a horizontal axis representing angle in units of degrees and a vertical axis in normalized units of volts.

A target 210 as may be similar to the gear 12 of FIG. 1 includes features 210a, 210b such as may represent gear teeth for example. The mechanical profile of target 210 that reflects the target geometry is represented by waveform 214 having a horizontal axis representing angle in the same units of degrees as waveforms 200.

As the target 210 rotates and features 210a, 210b pass the plurality of sensing elements of the sensor, measured magnetic field signals 208a, 208b are generated. For example, measured magnetic field signals 208a, 208b can correspond to signals 38a, 38b of FIG. 1. Thus, it can be seen that the phase separation of measured magnetic field signals 208a, 208b (referred to herein as a first predetermined phase difference) can be on the order of ninety degrees.

Operate and release threshold levels 220a, 220b (i.e., BOP, BRP, respectively) are shown in relation to the measured magnetic field signals 208a, 208b. As an example, the BOP threshold level 220a can represent a first percentage (e.g., 60%) of the peak-to-peak value of magnetic field signal 208a and the BRP threshold level 220b can represent a second, different percentage (e.g., 40%) of the peak-to-peak value of magnetic field signal 208a. Other threshold levels are possible including but not limited to other percentages of the peak-to-peak magnetic field signal, thresholds that are a predetermined percentage or a predetermined absolute difference with respect to positive and negative peaks of the magnetic field signal, etc.

By operation of detector circuitry (e.g., by detector circuits 36a, 36b of FIG. 1 or controller 110 of FIG. 1B for example), channel output signals 230a, 230b based on respective measured magnetic field signals 208a, 208b are generated. When measured magnetic field signal 208a crosses the BRP threshold level 220b, the respective channel output signal 230a transitions, here to a logic high level, and when measured magnetic field signal 208a crosses the BOP threshold level 220a, the respective channel output signal 230a transitions, here to a logic low level. Channel output signal 230b is generated in a similar manner based on crossings of the measured magnetic field signal 208b with the BOP threshold level 220a and the BRP threshold level 220b, as shown. The result is channel output signals 230a, 230b based on respective measured magnetic field signals 208a, 208b, which channel output signals which have a phase separation relative to one another that is established by the phase separation between the measured magnetic field signals 208a, 208b. Thus, the channel output signals 230a, 230b have the same predetermined phase separation with respect to each other as the measured magnetic field signals 208a, 208b have with respect to each other.

By operation of a controller (e.g., 48a, 48a', 110, 180), virtual magnetic field signal 204 is generated based on the measured magnetic field signals 208a, 208b with a second predetermined phase difference with respect to at least one of the signals 208a, 208b. In embodiments, the second predetermined phase difference can be with respect to each of the measured magnetic field signals 208a, 208b resulting in the virtual signal 204 being evenly spaced with respect to both signals 208a, 208b. In other embodiments, the virtual signal 204 can be unevenly spaced with respect to signals 208a, 208b (i.e., virtual signal 204 can be closer to signal 208a than it is to signal 208b).

The sensor may be user programmable to select a desired number of virtual magnetic field signals to be generated and also to select the desired phase difference between the virtual magnetic field signal(s) and the measured magnetic field signals. For example, the sensor may permit a user to select a desired resolution and, on that basis, the controller can determine how many virtual magnetic field signals will be generated and their respective phases, as will be illustrated in connection with FIG. 4.

Detector circuitry and techniques can be used to process the virtual magnetic field signal 204 to generate a respective virtual channel output signal 234 based on crossings of the virtual magnetic field signal 204 with the threshold levels 220a, 220b. When virtual magnetic field signal 204 crosses the BRP threshold level 220b, the respective virtual channel output signal 234 transitions, here to a logic high level, and when virtual magnetic field signal 204 crosses the BOP threshold level 220a, the respective virtual channel output signal 234 transitions, here to a logic low level, as shown.

Figure 3:
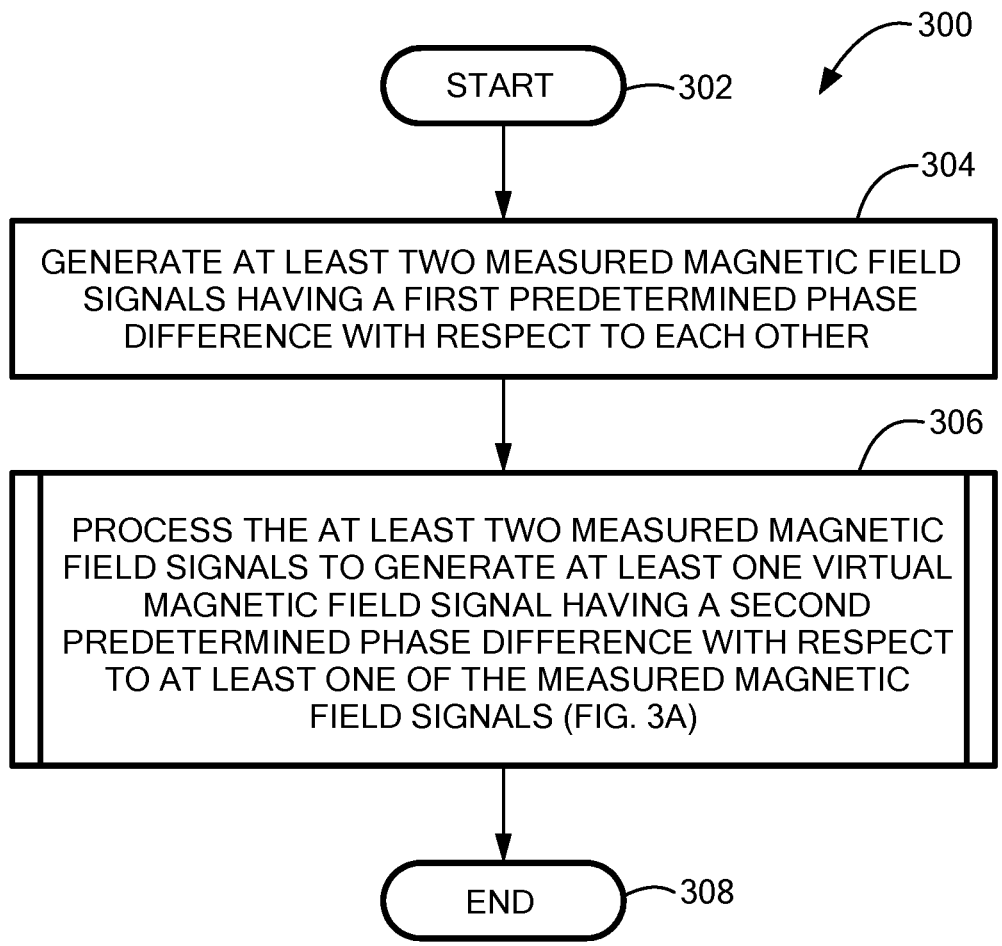
FIG. 3 is a simplified flow diagram illustrating a method of generating one or more virtual magnetic field signals according to the disclosure.

Referring also to the flow diagram of FIG. 3, a method 300 of generating a virtual magnetic field signal begins at block 302, following which at least two measured magnetic field signals having a first predetermined phase difference with respect to each other are generated in block 304. Generating the magnetic field signals may be accomplished with magnetic field sensing elements, such as the Hall effect elements 20a, 20b, 20c of FIGS. 1 and 1A or the magnetoresistance elements 20a', 20b' in FIG. 1B, for example.

In block 306 (as shown in more detail in FIG. 3A), the phase separated measured magnetic field signals are used to generate at least one virtual magnetic field signal having a second predetermined phase difference with respect to at least one of the magnetic field signals, as may be accomplished with sensor controller circuitry and techniques. The measured and virtual magnetic field signals can be processed by detector circuitry and techniques to generate respective channel output signals for communicating high resolution information about the target angle for example.

Figure 3A:
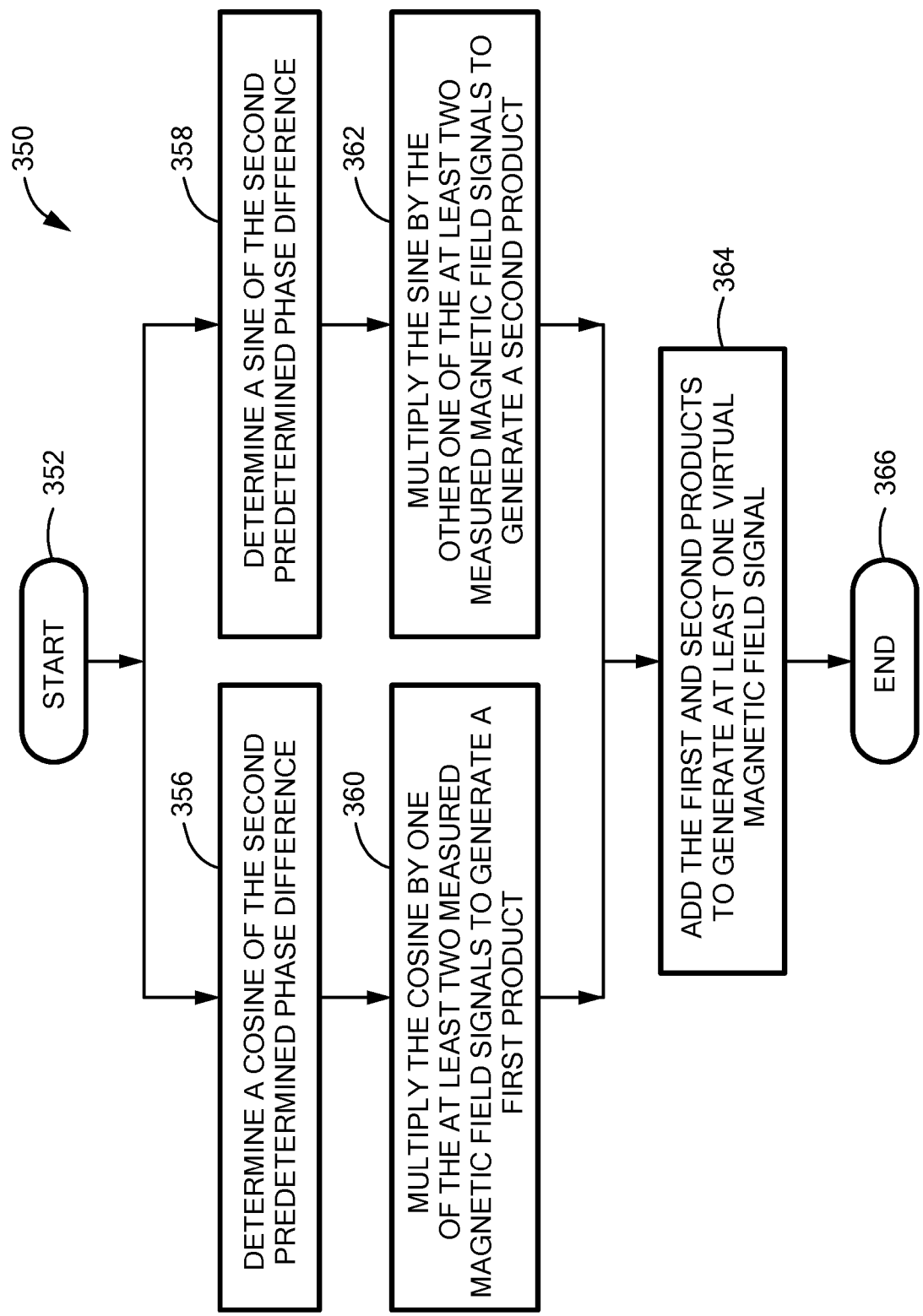
FIG. 3A is a flow diagram illustrating a method of generating one or more virtual magnetic field signals according to the disclosure.

An example subprocess for generating the virtual magnetic field signal is illustrated by the flow diagram of FIG. 3A and can include the use of a mathematical function that characterizes a relationship between the second predetermined phase difference and the measured magnetic field signals. For example, values of the virtual magnetic field signal can be computed according to the following:

cos(phase)*$Ch1$+sin(phase)*$Ch2$ where "phase" represents the second predetermined phase separation between the virtual magnetic field signal and the measured magnetic field signals relative to a single period of the measured magnetic field signal (e.g., a target rotation from an edge of one feature to a like edge of the next feature). Thus, in the example of FIG. 2, where it is desired to generate a single virtual magnetic field signal 204 evenly spaced between signals 208a, 208b, "phase" is given by 45°. In the above function, "Ch1" represents the magnitude of one of the measured magnetic field signals (e.g., 208a) and "Ch2" represents the magnitude of the other one of the measured magnetic field signals (e.g., 208b).

The subprocess 350 of FIG. 3A begins at block 352. In block 356, the cosine of the second predetermined phase is determined and in block 358, the sine of the second predetermined phase is determined. Various components and techniques can be used to determine the desired sine and cosine values. In an example embodiment, a look-up table (as may be stored in EEPROM for example) is used to determine the cosine and sine values. This type of configuration can be desirable in sensors containing binary digital logic since sine and cosine function computations can be difficult to implement. In other embodiments, such as those containing a microprocessor, the sine and cosine values can be computed directly.

Considering embodiments using a look-up table to determine the desired sine and cosine values, contents of an example look-up table can be given by the following:

in which the desired virtual phase is 45°, in block 356 binary equivalent value 0.1011 of the cosine of 45° can be determined. In block 358, binary equivalent value of 0.1011 of the sine of 45° can be determined.

Furthermore, because the cosine values can be negative for some desired phase separations of the virtual magnetic field signal, the ADC(s) that convert the measured magnetic field signals to digital values can be offset such that a midpoint of available codes corresponds to zero. For example, in the case of a 12-bit ADC providing 4096 codes, the midpoint code of 2048 can be used to represent zero volts.

Having thus determined the cosine and sine values for the desired phase for the virtual signal being generated, the binary equivalent value can provide a fixed coefficient for use in subsequent process blocks 360, 362. In block 360, the cosine value thus determined is multiplied by the value of one of the measured magnetic field signals (e.g., Ch1 as may correspond to signal 208a) and in block 362, the sine value thus determined is multiplied by the value of the other one of the measured magnetic field signals (e.g., Ch2 as may correspond to signal 208b). In block 364, the products determined in blocks 360 and 362 are added to thereby determine the corresponding value of the virtual magnetic field signal (e.g., signal 204) and the subprocess ends at block 366.

Figure 4:
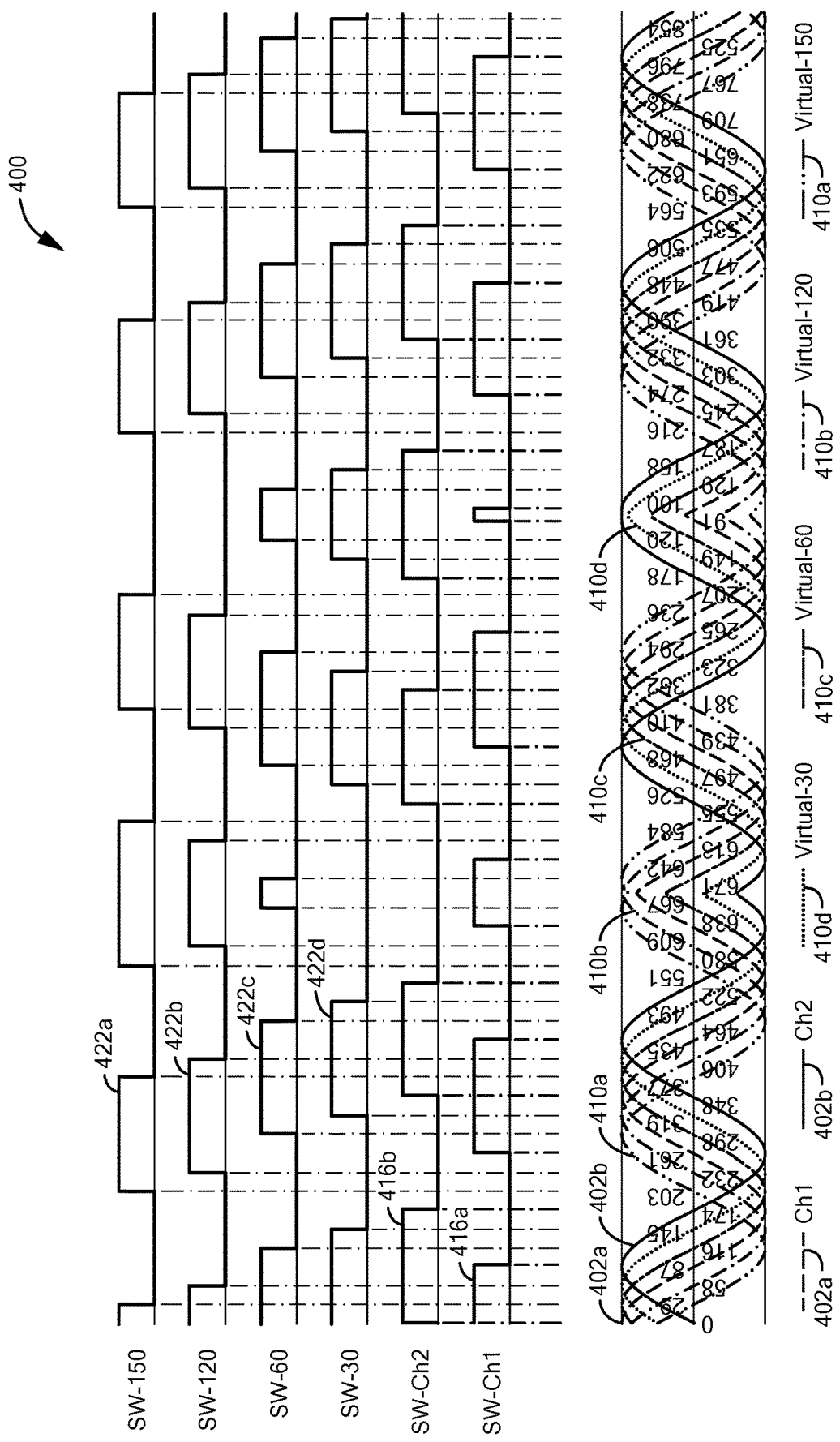
FIG. 4 shows example waveforms, including measured magnetic field signals, a plurality of virtual magnetic field signals, and associated channel output signals according to the disclosure as may be generated by any of the sensors of FIGS. 1-1C.

Referring also to FIG. 4, example waveforms 400 are shown in connection with a sensor generating more than one virtual magnetic field signal, and here four virtual magnetic field signals 410a, 410b, 410c, 410d. Also shown are measured magnetic field signals 402a, 402b against a horizontal axis representing angle in units of degrees and a vertical axis in normalized units of volts.

In the example of FIG. 4, each of the virtual magnetic field signals 410a-410d is evenly spaced between the measured magnetic field signals 402a, 402b. Thus, the phase separation between each consecutive signal 402a, 402b, 410a, 410b, 410c, and 410d is 30°.

The number of virtual signals and the phase separation between the virtual signals can be determined by the sensor controller in response to a user selection of a programming option. In the illustrated example, the user may have selected to receive twelve edges for each period, or gear tooth for example. With such resolution selected and based on knowledge of the target (i.e., how many periods the target represents), the sensor controller can determine that four virtual magnetic field signals with a phase separation of 30°

| Virtual Phase | Cos(virtual phase) | Approximate decimal value of cos(virtual phase) | Binary equivalent of approximate decimal value of cos (virtual phase) | Sin(virtual phase) | Approximate decimal value of sin(virtual phase) | Binary equivalent of approximate decimal value of sin (virtual phase) |
|---|---|---|---|---|---|---|
| 30 | 0.866 | 0.8125 | 0.1101 | 0.5 | 0.5 | 0.1000 |
| 45 | 0.707 | 0.6875 | 0.1011 | 0.707 | 0.6875 | 0.1011 |
| 60 | 0.5 | 0.5 | 0.1000 | 0.866 | 0.8125 | 0.1101 |
| 120 | −0.5 | −0.5 | −0.1000 | 0.866 | 0.8125 | 0.1101 |
| 135 | −0.707 | −0.6875 | −0.1011 | 0.707 | 0.6875 | 0.1011 |
| 150 | −0.866 | −0.8125 | −0.1101 | 0.5 | 0.5 | 0.1000 |

In an implementation containing a look-up table, a binary equivalent of a decimal approximation of the desired sine and cosine values can be used. For example, considering generation of the virtual magnetic field signal 204 (FIG. 2)

between each other and between each of the measured magnetic field signals should be generated. Alternatively, a user can provide a "resolution improvement factor" where the standard 4 edges per period generated by the physical channels could be scaled by 2× (resulting in 8 edges) or 3× (resulting in 12 edges) by using added virtual channels.

By detector operation, each of the magnetic field signals 402a, 402b, 410a, 410b, 410c, and 410d can be processed to generate a respective channel output signal according to threshold crossings as discussed above. For example, measured magnetic field signals 402a, 402b can be used to generate respective channel output signals 416a, 416b and virtual magnetic field signals can be used to generate respective virtual channel output signals 422a, 422b, 422c, and 422d.

Consideration of the measured channel output signals 416a, 416b reveals that, for each period (i.e., from one target tooth edge to the like edge of the next tooth), four switch events (i.e., four transitions of measured channel output signals 416a, 416b) occur. By contrast, use of both the measured channel output signals 416a, 416b and the four virtual channel output signals 422a, 422b, 422c, 422d results in twelve switch events per period. Accordingly, a 3x improvement in target sensing resolution is achieved.

It will be appreciated that in applications in which the required number of virtual signals is an odd number, the measured channel output signals may not be used for target detection. In other words, if the number of virtual signals is such that their even phase separation within each 360° period would result in uneven phase separation with respect to the measured magnetic field signals, then only the virtual channel output signals may be used to control the target. For example, if the user programmed resolution and target are such as to require that five virtual magnetic field signals be generated at relative phases of 72°, 144°, 216°, 288°, and 360°, then the measured magnetic field signals at approximately 0° and 90° can be ignored for target control purposes.

Also illustrated in FIG. 4 are two direction changes which can represent a change in the direction of rotation of the target. As noted above, the relative lead or lag of edges of the channel output signals can be used to determine the direction of rotation of the target. The increased target detection resolution provided by the virtual channel output signals 422a, 422b, 422c, 422d can result in a more rapid determination of a direction change than otherwise possible.

All references cited herein are hereby incorporated herein by reference in their entirety. Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
   a plurality of magnetic field sensing elements configured to generate at least two measured magnetic field signals indicative of a magnetic field affected by an object and having a first predetermined phase difference with respect to each other; and
   a controller responsive to the at least two measured magnetic field signals and configured to generate at least one virtual magnetic field signal having a second predetermined phase difference with respect to at least one of the measured magnetic field signals.

2. The magnetic field sensor of claim 1, wherein the at least one virtual magnetic field signal has the second predetermined phase difference with respect to each of the at least two measured magnetic field signals.

3. The magnetic field sensor of claim 1, wherein the controller is configured to generate the at least one virtual magnetic field signal according to a mathematical function that characterizes a relationship between the second predetermined phase difference and each of the at least two measured magnetic field signals.

4. The magnetic field sensor of claim 3, wherein the mathematical function is used to generate the at least one virtual magnetic field signal based on a cosine of the second predetermined phase difference and a sine of the second predetermined phase difference.

5. The magnetic field sensor of claim 4, wherein the controller comprises a look-up table containing cosine values of the second predetermined phase difference and sine values of the second predetermined phase difference.

6. The magnetic field sensor of claim 1, wherein the first predetermined phase difference between the at least two measured magnetic field signals is approximately ninety degrees.

7. The magnetic field sensor of claim 1, wherein the controller is responsive to the at least two measured magnetic field signals to generate a plurality of virtual magnetic field signals, each having a respective, different predetermined phase difference with respect to each of the at least two measured magnetic field signals.

8. The magnetic field sensor of claim 1, wherein the controller is programmable to select the second predetermined phase difference of the at least one virtual magnetic field signal.

9. The magnetic field sensor of claim 1, wherein the controller is configured to compare each of the at least two measured magnetic field signals to a threshold to generate respective channel output signals and is further configured to compare the at least one virtual magnetic field signal to the threshold to generate a virtual channel output signal.

10. The magnetic field sensor of claim 1, wherein the plurality of magnetic field sensing elements comprises one or more Hall effect elements and/or magnetoresistance elements.

11. The magnetic field sensor of claim 1, wherein the plurality of magnetic field sensing elements comprises at least one first element having an axis of maximum sensitivity in a first plane and at least one second element having an axis of sensitivity in a second plane orthogonal to the first plane.

12. The magnetic field sensor of claim 1, further comprising a back bias magnet to generate the magnetic field and wherein the object comprises a ferromagnetic object.

13. A method comprising:
    generating at least two measured magnetic field signals indicative of a magnetic field affected by an object, wherein the at least two measured magnetic field signals have a first predetermined phase difference with respect to each other; and
    processing the at least two measured magnetic field signals to generate at least one virtual magnetic field signal having a second predetermined phase difference with respect to at least one of the measured magnetic field signals.

14. The method of claim 13, wherein processing the at least two measured magnetic field signals comprises generating the at least one virtual magnetic field signal having the second predetermined phase difference with respect to each of the at least two measured magnetic field signals.

15. The method of claim 13, wherein processing the at least two measured magnetic field signals comprises computing values of the at least one virtual magnetic field signal according to a mathematical function that characterizes a relationship between the second predetermined phase difference and each of the at least two measured magnetic field signals.

16. The method of claim 13, wherein computing values of the at least one virtual magnetic field signal according to the mathematical function comprises computing a cosine of the second predetermined phase difference and a sine of the second predetermined phase difference.

17. The method of claim 13, wherein processing the at least two measured magnetic field signals comprises processing the at least two measured magnetic field signals to generate a plurality of virtual magnetic field signals, each having a respective, different predetermined phase difference with respect to each of the at least two measured magnetic field signals.

18. The method of claim 13, wherein processing the at least two measured magnetic field signals comprises responding to a programmable selection of the second predetermined phase difference.

19. The method of claim 13, further comprising generating at least two channel output signals by comparing the at least two measured magnetic field signals to a threshold and generating a virtual channel output signal by comparing the at least one virtual magnetic field signal to the threshold.

20. The method of claim 13, wherein generating at least two measured magnetic field signals comprises using one or more Hall effect elements and/or magnetoresistance elements.

21. The method of claim 20, wherein generating at least two measured magnetic field signals comprises using differential signals from three spaced Hall effect elements.

22. The method of claim 20, wherein generating at least two measured magnetic field signals comprises using at least one first element having an axis of maximum sensitivity in a first plane and at least one second element having an axis of sensitivity in a second plane orthogonal to the first plane.

23. Apparatus comprising:
   means for generating at least two measured magnetic field signals indicative of a magnetic field affected by an object and having a first predetermined phase difference with respect to each other; and
   means for generating at least one virtual magnetic field signal based on the at least two measured magnetic field signals, the at least one virtual magnetic field signal having a second predetermined phase difference with respect to at least one of the measured magnetic field signals.

* * * * *